United States Patent
Sudo et al.

(10) Patent No.: US 9,115,445 B2
(45) Date of Patent: Aug. 25, 2015

(54) VITREOUS SILICA CRUCIBLE

(75) Inventors: Toshiaki Sudo, Akita (JP); Hiroshi Kishi, Akita (JP); Makiko Kodama, Akita (JP)

(73) Assignee: SUMCO CORPORATION, Tokyo (JP)

( * ) Notice: Subject to any disclaimer, the term of this patent is extended or adjusted under 35 U.S.C. 154(b) by 6 days.

(21) Appl. No.: 13/148,457

(22) PCT Filed: Dec. 13, 2010

(86) PCT No.: PCT/JP2010/072339
§ 371 (c)(1),
(2), (4) Date: Jun. 22, 2012

(87) PCT Pub. No.: WO2011/071176
PCT Pub. Date: Jun. 16, 2011

(65) Prior Publication Data
US 2012/0260852 A1   Oct. 18, 2012

(30) Foreign Application Priority Data
Dec. 11, 2009   (JP) .................................. 2009-282138

(51) Int. Cl.
| C30B 35/00 | (2006.01) |
| C03C 19/00 | (2006.01) |
| C03C 23/00 | (2006.01) |
| C30B 15/10 | (2006.01) |

(52) U.S. Cl.
CPC ............. *C30B 35/002* (2013.01); *C03C 19/00* (2013.01); *C03C 23/0025* (2013.01); *C30B 15/10* (2013.01); *Y10T 117/1032* (2015.01)

(58) Field of Classification Search
CPC .............................. C30B 35/002; C30B 15/10
USPC ........................... 117/200, 208, 213, 900, 13
See application file for complete search history.

(56) References Cited

U.S. PATENT DOCUMENTS

| 6,548,131 B1 * | 4/2003 | Fabian et al. ................ 428/34.4 |
| 2005/0235907 A1 | 10/2005 | Ohama et al. |
| 2007/0256628 A1 * | 11/2007 | Saito et al. .................... 117/213 |
| 2009/0151624 A1 * | 6/2009 | Shimazu ....................... 117/208 |

(Continued)

FOREIGN PATENT DOCUMENTS

| EP | 1045046 A2 | 10/2000 |
| JP | 03-081368 U | 8/1991 |
| JP | 08-245230 A | 9/1996 |

(Continued)

OTHER PUBLICATIONS

Patent Abstracts of Japan, English Abstract and computer translation of JP 2005-272178 A (2014).*

(Continued)

*Primary Examiner* — Matthew Song
(74) *Attorney, Agent, or Firm* — Law Office of Katsuhiro Arai

(57) ABSTRACT

Provided is a vitreous silica crucible which has a special region for suppressing vibration of melt surface during pulling of a silicon single crystal and at the same time, a marking capable of accurately monitoring a changed position of the melt surface when passing through the special region. The special region for preventing sloshing of silicon melt is provided on an inner wall of a straight body portion, and the marking is provided at least at an upper end and a lower end of the special region.

4 Claims, 1 Drawing Sheet

(56) References Cited

U.S. PATENT DOCUMENTS

2010/0319609 A1 12/2010 Sato
2011/0011334 A1 1/2011 Shimazu et al.

FOREIGN PATENT DOCUMENTS

| JP | 2004-059410 A | 2/2004 |
| JP | 2004-250305 A | 9/2004 |
| JP | 2005-272178 A | 10/2005 |
| JP | 2005272178 A * | 10/2005 | ............... C30B 15/10 |
| JP | 2009-067624 A | 4/2009 |
| WO | 2009/054529 A | 4/2009 |
| WO | 2009107834 A1 | 9/2009 |

OTHER PUBLICATIONS

Extended European Search Report (EESR) mailed Jul. 25, 2012, issued in corresponding Application No. EP 10836095.9.
International Search Report for PCT/JP2010/072339 (mailing date: Jan. 25, 2011).

* cited by examiner

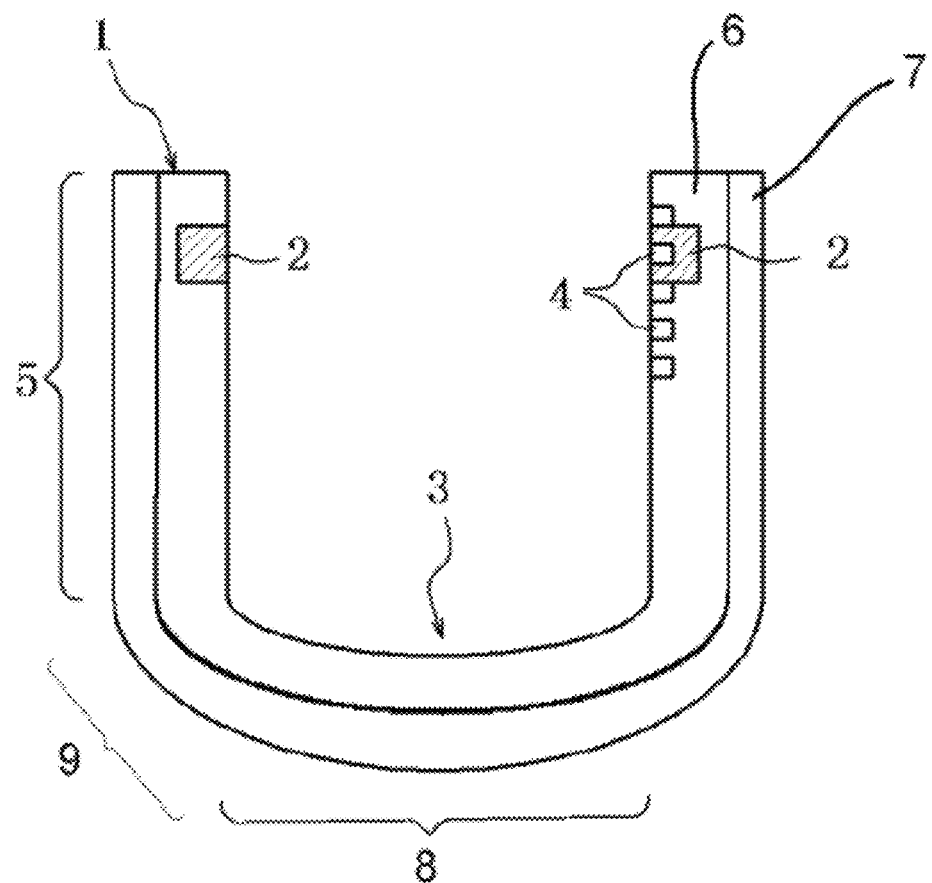

VITREOUS SILICA CRUCIBLE

TECHNICAL FIELD

The present invention relates to a vitreous silica crucible for pulling of silicon single crystals.

BACKGROUND ART

In the manufacturing of semiconductor devices, etc. used in electronics technologies leading information-oriented society, silicon wafers may not be omitted. Characteristics of silicon wafers include micro defects such as oxygen precipitate, dislocation, oxygen stacking faults and the like. Micro defects are advantageous for capturing heavy metal pollution that occurs in a device process, but may become a source of device failure. Therefore, there may be a need to adjust the oxygen concentration in a crystal to a predetermined concentration corresponding to types of devices or device processes used.

As a current method of manufacturing silicon single crystals, the "Czochralski method" (hereinafter referred to as "CZ method") of manufacturing silicon single crystals through pulling is generally used. In addition, there is a method called the magnetic field applied Czochralski method (MCZ method) which is a CZ method peformed under a strong magnetic field. The CZ method includes a magnetic field applied Czochralski (MCZ) method in which a strong magnetic field is formed.

In the CZ method, a polycrystalline silicon that is highly purified with a metal impurity concentration of a few ppb (parts-per-billion, 1 ppb=$10^{-9}$) or less is generally put into a high-purity vitreous silica crucible together with a resistivity control dopant (e.g., boron (B) or phosphorous (P)) and is melted at a temperature of about 1,420 deg. C. Continuously, a seed crystal silicon rod is brought into contact with a surface of silicon melt, the seed crystal or the vitreous silica crucible is rotated to make the seed crystal thin (dislocation-free) and then the seed crystal is pulled, thereby enabling a silicon single crystal ingot having the same atomic structure as the seed crystal to be obtained.

As aforementioned, the vitreous silica crucible is a container to put silicon melt therein when pulling molten polycrystalline silicon into a single crystal. The amount of the silicon melt in the vitreous silica crucible is decreased in inverse proportion to the amount of silicon single crystal pulled, and the level of the surface of the silicon melt (hereinafter referred to as "melt surface") is changed in the vitreous silica crucible. It is general practice to directly observe and monitor the changing level of the melt surface, but such direct observation has the problem in that the decrease in volume of the silicon melt cannot be accurately measured.

Recently, silicon single crystal ingots have been advanced to a large diameter (of 300 mm or more). The large diameter of the silicon single crystal ingot is problematic in that the phenomenon can easily occur in which the melt surface of the silicon melt sloshes (vibrates) between a portion where a neck part is formed and a portion where a shoulder part is formed, for a duration of a few minutes to a few hours. As a countermeasure to the foregoing problem, methods for preventing vibration of the melt surface have been considered, such as a method of applying a magnetic field to the melt surface through the foregoing MCZ method, a method of providing a region, called a special region, in the vitreous glass crucible for preventing the sloshing of the melt surface, or the like. However, a method of completely preventing the vibration of the melt surface under any pulling condition has not yet been found. Therefore, even in the case where the melt surface is disposed in the special region, a countermeasure that is employed is one where the pulling rate is decreased during a period in which vibration of the melt surface is easily generated.

In a conventional vitreous silica crucible, even though the foregoing special region is provided, the special region cannot be discerned by its appearance. Also, since a carbon susceptor supporting the vitreous silica crucible reacts with an outer surface of the vitreous silica crucible during the pulling of a silicon single crystal, so that an inner diameter of the carbon susceptor is changed whenever the carbon susceptor is used, initial melt surfaces are not always at the same level, although silicon raw material is filled by the same weight in the vitreous silica crucible. Therefore, although a distance between an initial melt surface level and a melt surface level changed during pulling is known, a relative position between the melt surface and the special region provided in the vitreous silica crucible cannot accurately be known.

That is, for example, although the sloshing of the melt surface disappears, and the seed crystal arrives at a region beyond the special region and may increase the pulling rate of a silicon single crystal, it may not be determined whether the sloshing disappears due to an effect of the special region or whether a region is one which may increase the pulling rate, and in a real process, it is problematic that the pulling rate of silicon single crystal may not be increased. In relation to this problem, patent document 1 below discloses that a position measuring apparatus is provided at a side of a single crystal pulling apparatus.

PRIOR ART REFERENCE

Patent Document

Patent Document 1: Japanese Patent Application Laid-Open No. 2009-67624

SUMMARY OF THE INVENTION

Problems to be Solved by the Inventions

However, with the technique disclosed in the foregoing patent document 1, although large-scale dedicated equipment is needed, only a changed amount of the melt surface may be measured, and when a vitreous silica crucible with a special region is used, if the vitreous silica crucible is deformed during pulling of a silicon single crystal, the positional relation between the melt surface and the special region may not be found.

The present disclosure provides a vitreous silica crucible, which has a special region for suppressing vibration of a melt surface during pulling of a silicon single crystal and can accurately detect the position of the melt surface and the position of the special region even when the vitreous silica crucible is partially deformed due to the weight of silicon melt or the like. The present disclosure also provides a vitreous silica crucible provided with a marking, which can simply realize an optimal pulling rate while suppressing vibration of a melt surface during pulling of a silicon single crystal by accurately detecting the position of the melt surface and the position of the special region as above.

Means for Solving the Problems

The summarized configurations of the present invention are as follows.

(1) A vitreous silica crucible for containing a silicon melt, the vitreous silica crucible including: a special region provided on an inner wall of a straight body portion, for preventing sloshing of the silicon melt; and a marking installed at least at an upper end and a lower end of the special region.

(2) The vitreous silica crucible described in the above (1), wherein the special region is made of vitreous silica whose raw material is primarily natural silica, and a transparent layer other than the special region is made of vitreous silica whose raw material is primarily synthetic silica.

(3) The vitreous silica crucible described in the above (1), wherein the special region is made from vitreous silica containing bubbles therein.

(4) The vitreous silica crucible described in the above (1), wherein the special region has an uneven surface.

(5) The vitreous silica crucible described in the above (4), wherein the uneven surface is comprised of a plurality of slits.

(6) The vitreous silica crucible described in any one of the above (1) to (5), wherein the special region is installed between 5 mm downward from an edge portion of an opening of the vitreous silica crucible and 100 mm upward from the center of a bottom surface of the vitreous silica crucible, and the special region has a width ranging from 1 mm to 100 mm.

(7) The vitreous silica crucible described in any one of the above (1) to (6), wherein the marking is a laser marking.

(8) The vitreous silica crucible described in any one of the above (1) to (6), wherein the marking is a diamond tool marking.

Effect of the Invention

According to the present disclosure, for example, although the vitreous silica crucible is deformed due to the mass of silicon melt during pulling of a silicon single crystal, a change in position of the melt surface with respect to a position of the special region can be accurately detected. Therefore, directly after the melt surface has passed the special region for preventing vibration of the melt surface, it becomes possible to increase the pulling rate of silicon single crystal, thereby contributing to the enhancement of productivity.

BRIEF DESCRIPTION OF THE DRAWINGS

FIG. 1 is a cross sectional view schematically illustrating a vitreous silica crucible.

DESCRIPTION OF THE EMBODIMENTS

Hereinafter, exemplary embodiments will be described in detail with reference to the accompanying drawings. Like reference numerals in the drawings denote like elements, and thus their description will be omitted.

A vitreous silica crucible is illustrated in a sectional view in FIG. 1. The vitreous silica crucible 1 in accordance with an exemplary embodiment is characterized by having a special region 2 provided on an inner wall of a straight body portion 5, which is used in pulling of a silicon single crystal by the CZ method or the like, to prevent a change of a melt surface, and a marking 4 which is positioned at least at an upper end and a lower end of the special region 2 and is detectable (e.g., visually determinable (visually recognizable)) from an exterior of a CZ furnace. Also, the vitreous silica crucible 1 in accordance with an exemplary embodiment may be used in any of single pulling and multi pulling methods.

First, the configuration of the vitreous silica crucible 1 will be described. As illustrated in the sectional view of FIG. 1, the vitreous silica crucible 1 includes the cylindrical straight body portion 5 having a corner portion 9 with a relatively large curvature and an edge portion of which the upper end is open, and a bottom portion 8 formed in a straight line or a curved line having a relatively small curvature and having a mortar shape. Also, in the description of the present disclosure, the corner portion 9 is a portion connecting the straight body portion 5 and the bottom portion 8, and denotes a portion from a point where the tangent of a curved line of the corner portion 9 overlaps the straight body portion 5 of the vitreous silica crucible to a point having a common tangent to the bottom portion. The vitreous silica crucible 1 has, from the inner side toward the outer side thereof, a vitreous silica layer (hereinafter referred to as "transparent layer 6") which does not substantially have bubbles (has a bubble content of less than 0.5%), and a vitreous silica layer (hereinafter referred to as "bubble containing layer 7") having a bubble content of from 0.5% or more to less than 50%. In the description of the present disclosure, the bubble content denotes the ratio (w2/w1) of a bubble occupying volume (w2) to a constant volume (w1) of the vitreous silica crucible 1.

Next, a marking 4 position will be described. In FIG. 1, reference numeral 1 is an edge portion of an opening of the vitreous silica crucible, reference numeral 2 is the special region provided in an inner wall of the crucible, for preventing sloshing of a melt surface, reference numeral 3 is a center of the bottom portion, reference numeral 4 is the marking, and reference numeral 5 is a range (straight body portion 5) in which the marking 4 is capable of being provided. In the drawing, the range in which the marking 4 is capable of being provided is preferably selected from the range of the straight body portion 5.

Herein, it is necessary to install the marking 4 at least at the upper end and lower end of the special region 2. This is because the marking 4 becomes a mark for confirming a change point in pulling condition. In addition to the upper end and lower end of the special region 2, the marking 4 may be provided at a position other than the straight body portion 5, for confirmation of the melt content.

The special region 2 is, as described above, provided in the inner wall of the vitreous silica crucible 1 to decrease the sloshing (vibration) phenomenon of silicon melt when a silicon lump is made molten and then pulled into a single crystal ingot. In this exemplary embodiment, the special region 2 may be composed of natural vitreous silica obtained by fusing natural silica, and the inner wall of the transparent layer 6 of the vitreous silica crucible 1 other than the special region 2 may be composed of synthetic vitreous silica.

Herein, it is meant that silica powder (synthetic silica powder) for forming the synthetic vitreous silica is formed from synthetic silica, and the synthetic silica is a raw material produced through chemical synthesis. Since the raw material for the synthetic silica is gas or liquid, it is possible to easily refine the synthetic silica, and the synthetic silica powder may be prepared with a higher purity than the natural silica powder. Also, the synthetic vitreous silica powder is amorphous. As the raw materials for the synthetic vitreous silica powder, there are gas raw materials such as carbon tetrachloride or the like, and a silicon alkoxide liquid raw material. In the case of the synthetic glass powder, it is possible to control all impurities at a concentration of 0.1 ppm or less.

In the synthetic vitreous silica powder produced by a sol-gel process, 50 ppm to 100 ppm of silanol generated by hydrolysis of alkoxide remains typically. In the synthetic vitreous silica powder using carbon tetrachloride as a raw material, it is possible to control silanol in a wide range of 0 to 1000 ppm, but 100 ppm of chlorine is typically contained.

In the case of using alkoxide as a raw material, synthetic vitreous silica powder which does not contain chlorine may be easily obtained.

As aforementioned, the synthetic vitreous silica powder obtained by the sol-gel process contains 50 ppm to 100 ppm of silanol before being molten. When the synthetic vitreous silica powder obtained by the sol-gel process is molten in vacuum, separation of silanol occurs and thus silanol content in the synthetic vitreous silica obtained is decreased to 5 ppm to 30 ppm. Also, the silanol content may be different depending on fusing conditions such as fusing temperature, elevation temperature, etc. In addition, silanol content in the natural vitreous silica obtained by fusing natural silica powder under the same condition is 50 ppm or less.

Generally, it is known that synthetic vitreous silica is lower in viscosity at a high temperature than natural vitreous silica obtained by fusing natural silica powder. As one such reason, it may be considered that silanol or halogen cuts the network structure of $SiO_4$ tetrahedron.

From the measurement of the transmittance of the synthetic vitreous silica obtained by fusing synthetic vitreous silica powder, it can be understood that the synthetic vitreous silica well transmits ultraviolet rays having a wavelength of up to about 200 nm, and has a similar characteristic to the synthetic vitreous silica which is obtained from a raw material of carbon tetrachloride and is used for ultraviolet optical purposes.

Also, in the case of the synthetic vitreous silica obtained by fusing synthetic vitreous silica powder, when a fluorescent spectrum as excited to ultraviolet rays having the wavelength of 245 nm is measured, the fluorescent peak which is the same as that of a product obtained by fusing natural silica powder cannot be observed.

The natural silica powder indicates that the natural silica powder is prepared from natural silica, the natural silica is a raw material obtained through crushing, refinement and the like of naturally occurring silica gemstone, and the natural silica powder is obtained from α-quartz crystal. The natural silica powder contains Al and Ti of 1 ppm or more, and other impurities having a higher concentration that those contained in the synthetic silica powder. The natural silica powder contains almost no silanol. The silanol content in the natural vitreous silica obtained by fusing the natural silica powder is less than 50 ppm.

From the measurement of the transmittance of glass obtained from the natural silica powder, it can be seen that the transmittance is sharply decreased at a wavelength of 250 nm or less due to about 1 ppm of Ti mainly contained as an impurity, and approaches almost zero at a wavelength of 200 nm. Also, an absorption peak due to an oxygen defect can be seen at a wavelength of around 245 nm.

Additionally, from the measurement of a fluorescent spectrum obtained when a fused product of the natural silica powder is excited at the wavelength of 245 nm, fluorescent peaks are observed at the wavelengths of 280 nm and 390 nm. These fluorescent peaks are due to an oxygen bond defect in glass.

By measuring any of a concentration of a contained impurity, silanol content or transmittance, or by measuring a fluorescent spectrum obtained when a measurement target is excited by ultraviolet rays of 245 nm, it can be determined whether vitreous silica of the measurement target is made of natural silica or the synthetic silica.

During the fusion of the silica powder layer, the transparent layer 6 may be produced from the mold by decreasing the pressure to −50 kPa or more to less than −95 kPa. Also, after the transparent layer 6 is formed, the bubble containing layer 7 may be formed on an outer side of the transparent layer 6 by adjusting the pressure to +10 kPa to less than −20 kPa. At this time, in a region where the special region 2 should be formed, by providing a silica powder layer having the natural silica as a main component (e.g., natural silica/synthetic silica=2/1) as an inner layer and then fusing the silica powder layer while decreasing the pressure as above, the special region 2 may be easily formed. Also, in a region other than the region where the special region 2 should be formed, it is good to provide a silica powder layer having the synthetic silica as a main component as an inner layer and then melt the silica powder layer while decreasing the pressure as above.

While the synthetic and natural silica powders are used as raw materials in this exemplary embodiment, the "silica powder" referred in the description of the present disclosure is not limited to quartz powder, and may include conventionally well known material powders such as crystal, silica or the like including silicon dioxide (silica) as raw materials of the vitreous silica crucible if the foregoing conditions are satisfied.

Also, the special region 2 in accordance with the exemplary embodiment may be composed of vitreous silica containing bubbles therein. Additionally, in case of providing the special region 2 to a typical vitreous silica, it is good to provide an uneven surface to the special region 2. Additionally, the uneven surface may have a structure comprised of a plurality of slits.

The special region 2 will be described in more detail. In the exemplary embodiments of the present disclosure, methods of providing the special region 2 which are described below are not limited, and any of conventional methods of providing the special region 2 which are well known to prevent vibration of silicon melt may be used properly. A first method is the special region obtained from a raw material having natural vitreous silica as a main component, as aforementioned. An existence region of the natural vitreous silica has a thickness of about 2 mm from an inner wall and a width of, suitably, 100 mm or less, and more preferably, of about 30 mm in the height direction. Also, in the exemplary embodiment of the present disclosure, the layer having natural vitreous silica as a main component indicates a vitreous silica layer obtained from a raw material powder having a ratio of natural silica powder mass/synthetic silica powder mass being equal to 1 or more.

A second method is the special region 2 obtained from a vitreous silica containing bubbles therein. In the exemplary embodiment of the present disclosure, the bubbles refer to bubbles (having a diameter of about 5 μm or more) detectable with the naked eye by using light scattering. That is, the mean-diameter of the bubbles is preferably in the range of 5 μm to 50 μm, more preferably, in the range of 10 μm to 40 μm, and even more preferably, about 30 μm. Also, the existing density of the bubbles is preferably $10/cm^2$ or more, more preferably, $20/cm^2$ or more, even more preferably, $30/cm^2$ or more, and still more preferably, about $40/cm^2$. Also, the existing density of the bubbles is preferably $100/cm^2$ or less, and more preferably, $70/cm^2$ or less. Also, the thickness of the special region 2 is preferably 1 mm or more from an inner wall, and more preferably about 2 mm. The width in the height direction of the special region 2 is preferably less than 100 mm, and more preferably, about 40 mm. Also, the width in the height direction of the special region 2 is preferably 1 mm or more, and more preferably, 10 mm or more.

A third method is the special region 2 characterized by having an uneven surface. The characteristic of the uneven surface is preferably a ten-point mean roughness (Rz) of 0.1 mm or more, more preferably, 0.3 mm or more, and even more preferably, about 0.5 mm. Also, the mean roughness of the uneven surface is preferably 1.0 mm or less, and more preferably, 0.7 mm or less. Additionally, the width in the height direction of the special region is preferably within 100 mm, and more preferably, about 40 mm. Also, the width in the height direction of the special region 2 is preferably 1 mm or more, and more preferably, 10 mm or more. In the above description, the surface indicates the inner wall surface of the vitreous silica crucible 1.

A fourth method is the special region 2 characterized by having the uneven surface comprised of a plurality of slits. The characteristic of the slits is preferably a mean length of 10 mm or more, more preferably, 30 mm or more, and even more preferably, about 50 mm. Also, the mean-length of the slits is preferably 100 mm or less, and more preferably, 70 mm or less. The mean-width of the slits is preferably 0.1 mm or more, more preferably, 0.3 mm or more, and even more preferably, about 0.5. Also, the mean-width of the slits is preferably 1.0 mm or less, and more preferably, 0.7 mm or less. Additionally, the mean-depth of the slits is preferably 0.1 mm or more, more preferably, 0.3 mm or more, and even more preferably, about 0.5 mm. Also, the mean-depth of the slits is preferably 1.0 mm or less, and more preferably, 0.7 mm or less. Also, the existing density of the slits is preferably 5/cm$^2$ or more, more preferably, 10/cm$^2$ or more, and even more preferably about 20/cm$^2$. Also, the existing density of the slits is preferably 50/cm$^2$ or less, and more preferably, 30/cm$^2$ or less. Also, the width in the height direction of the special region 2 is suitably within 100 mm, and more preferably, about 40 mm. Also, the width in the height direction of the special region 2 is preferably 1 mm or more, and more preferably, 10 mm or more.

As exemplarily illustrated in FIG. 1, a position where the special region 2 is installed is preferably between 5 mm in the downward direction from an upper end of an opening of the vitreous silica crucible and 100 mm in the upward direction from a center of the bottom surface of the crucible, and more preferably, between 10 mm in the downward direction from an upper end of an opening of the vitreous silica crucible and 200 mm in the upward direction from a center of the bottom surface of the crucible. The width in the height direction of the special region 2 is preferably in the range of 1 mm to 100 mm. In the exemplary embodiment of the present disclosure, the height direction indicates an arrow direction in FIG. 1.

The shape of the marking 4 is a point (circle) or line (rectangle), and it is good that the number of points, the length of lines, etc. are observed while directly watching the marking 4 during pulling of a silicon single crystal (or are detected by using an optical measurement apparatus or the like), and are properly selected corresponding to the visibility of the real CZ furnace. For example, in the case of the points, the depth of each point is preferably half or less of the thickness of the vitreous silica crucible 1 at a depth of 0.1 mm or more, and more preferably ⅓ or less of the thickness of the vitreous silica crucible 1 at a depth of 0.2 mm or more. Also, the diameter thereof is preferably 0.5 mm or more, more preferably, 0.7 mm or more, and even more preferably, about 1 mm. Also, the diameter thereof is preferably 3.0 mm or less, and more preferably, 2.0 mm or less. Additionally, in the case of the lines, the depth of each line is preferably half or less of the thickness of the vitreous silica crucible 1 at a depth of 0.1 mm or more, and more preferably ⅓ or less of the thickness of the vitreous silica crucible 1 at a depth of 0.2 mm or more. Also, the width thereof is preferably 0.5 mm or more, more preferably, 0.7 mm or more, and even more preferably, about 1 mm. Also, the width thereof is preferably 3.0 mm or less, and more preferably, 2.0 mm or less. Additionally, the marking 4 is not necessarily needed to exist throughout the whole circumference of a horizontal surface of the vitreous silica crucible 1, but is preferably provided with a length of about 5 cm or more, and more preferably with the length of 10 cm or more.

The marking 4 in accordance with the exemplary embodiments of the present disclosure may be needed to be provided at least at an upper end and a lower end of the special region 2 because of the foregoing reason. At this time, since the marking 4 in the upper end does not contact the silicon melt almost or completely during pulling of a silicon single crystal, it is not so necessary to consider a decrease in the thickness of the vitreous silica crucible 1 itself.

Meanwhile, since the marking 4 in the lower end contacts the silicon melt, it is necessary to consider a decrease in the thickness of the vitreous silica crucible 1 itself.

In addition to the upper end and the lower end, the marking 4 in accordance with exemplary embodiments of the present disclosure may be provided between the upper end and the lower end, or at a lower position of the lower end. That is, in the case where the marking 4 is provided between the upper end and the lower end of the special region 2, the marking 4 may be used as a start point in the step of changing pulling conditions of a silicon single crystal. Also, in the case where the marking 4 is provided at the lower position of the lower end of the special region 2, the marking 4 may be used as a reference for detecting the remaining content of the silicon melt.

It is important that the marking 4 used in exemplary embodiments of the present disclosure is formed at a correct position with respect to the special region 2 and is visually recognizable (or detectable). The marking 4 is preferably a laser marking formed by a laser or a diamond tool marking formed by a diamond tool. In addition to the foregoing marking methods, all conventional well known marking methods, a marking using a very rigid drill or the like may be applied if such tools can form the marking 4 in silica materials. That is, the marking method is selected by the depth or length of the marking 4, but from among the foregoing marking methods, it is preferable to provide the marking 4 by using the foregoing diamond tool or laser, and in particular, a $CO_2$ gas laser.

Also, a well known diamond tool may be properly selected as the diamond tool used in the exemplary embodiments of the present disclosure by the shape of the marking 4. For example, the well known diamond tool may include a diamond wheel, a diamond tipped drill, or the like.

The forming of the marking using the diamond tool may be performed according to the following process.
1. Process of loading a crucible on a bottom plate having an opening for marking at a center thereof with a three-jaw scroll chuck tool for determining a central position of the crucible such that the opening of the crucible is directed toward the downward direction.
2. Process of determining the central position of the crucible with the three-jaw scroll chuck tool.
3. Process of elevating a diamond tool processor to an inner wall of the crucible.
4. Process of controlling a processing position.
5. Process of providing a marking with the diamond tool.
6. Process of sequentially and repeatedly forming a marking while the bottom plate having a servo controller rotates.
7. Process of returning the diamond tool processor to the original position.

While the embodiments of the present disclosure have been particularly shown and described with reference to the accompanying drawing, it will be understood by those of ordinary skill in the art that the embodiments are only examples and various changes in form and details may be made.

For example, in the case of the special region 2 primarily made of natural silica as illustrated in FIG. 1, the marking 4 in accordance with the exemplary embodiments of the present disclosure may be provided along the whole circumference of the crucible or along a portion of the circumference of the crucible.

EXAMPLES

Hereinafter, the present invention will be further described with Examples thereof, but the present invention is not limited to the Examples.

Example 1

A marking in accordance with Example 1 was formed in the following sequence in a vitreous silica crucible of about 800 mm in diameter, which was manufactured by a conventional well known method. The formed marking was a pointed shape of which the diameter is 1 mm. Also, in the present Example, a special region primarily made of natural silica (natural silica/synthetic silica=2/1) and having a width of 30 mm in the height direction and a depth of 100 μm was formed in the vitreous silica crucible.

[Laser Marking Sequence]
1. Process of loading a crucible on a bottom plate having an opening for marking at a center thereof with a three-jaw scroll chuck tool for determining a central position of the crucible such that the opening of the crucible is directed downward.
2. Process of determining the central position of the crucible with the three-jaw scroll chuck tool.
3. Process of elevating a laser processor to an inner wall of the crucible.
4. Process of controlling a distance between the inner wall of the crucible and a laser irradiation hole with a red semiconductor laser, equipped with the laser processor having a wavelength of 650 nm.
5. Process of providing a marking with the laser.
6. Process of sequentially and repeatedly forming a marking while the bottom plate having a servo controller rotates.
7. Process of returning the laser processor to the original position.

Also, the irradiation conditions of a $CO_2$ gas laser are as follows:
Oscillation wavelength: 10.6 μm;
Maximum power energy: 10 J;
Beam diffusion angle: 0.5 mrad;
Repeat: single, 0-12 Hz;
Pulse width: 180 ns;
Jitter: ±60 ns;
Switching type: semiconductor switching type; and
Laser processor dimension: W83 cm×H60 cm×D271 cm.

As a result of forming the marking in accordance with Example 1 with the above irradiation conditions, the special region primarily made of natural silica was visually observed properly.

Example 2

Next, the crucible used in Example 1 was heated to 1400 deg. C. to intentionally deform the crucible. When the laser marking was formed in accordance with Example 1, the special region primarily made of natural silica was visually observed accurately even when the crucible was deformed.

Example 3

The crucible used in Example 1 was loaded on a carbon susceptor having a spacing of about 7 mm at a corner portion, about 80 kg polycrystalline silicon was put in the crucible, the crucible was installed in a CZ furnace, the polycrystalline silicon in the crucible was molten at about 1450 deg. C. and maintained for 20 hours. The special region was visually observed from an exterior of the CZ furnace, and the special region primarily made of natural silica was visually observed accurately. After the crucible was cooled to room temperature, the spacing between the vitreous silica crucible and the carbon susceptor as measured was 2 mm, indicating a large deformation of the crucible. That is, even though the corner portion of the crucible was deformed by about 5 mm, the special region primarily made of natural silica in the vitreous silica crucible having the marking formed in accordance with Example 1 was observed accurately.

Example 4

Vitreous silica crucibles having the same specification as that in Example 1 were prepared. Some of the prepared crucibles were processed to have a laser marking formed in the conditions of Example 1, but the other as a comparative example was not processed. The respective crucibles were installed in the CZ furnace. A polycrystalline lump of about 100 kg was put in each of the vitreous silica crucibles, the CZ furnace was maintained in an argon gas atmosphere (at a pressure of 6.67 kPa) and was elevated in temperature from room temperature (20 deg. C.) to 1500 deg. C. for 10 hours, the elevated temperature was maintained for a predetermined time to melt the polycrystalline silicon lump and thus form silicon melt such that the melt surface of the silicon melt was positioned at the special region. At this time, in the vitreous silica crucible formed with the laser marking in accordance with the embodiment of the present invention, the marking in the upper end was observed, but the marking in the lower end was not observed due to the silicon melt. A seed crystal was dipped in the silicon melt prepared as above and then gradually pulled while rotating the crucible, to grow a silicon single crystal with a diameter of 400 mm and length of 0.3 m in a condition that the sloshing of the silicon melt is minimized.

When the conventional vitreous silica crucible not having a marking was used, 17 hours were taken for pulling. In contrast, when the vitreous silica crucible formed with the marking in accordance with embodiments of the present disclosure was used, the pulling rate was increased from 0.3 mm/min to 0.6 mm/min, and thus only 15 hours were taken for pulling. Due to the effect of the laser marking described with the embodiments of the present disclosure, it was confirmed that the productivity was enhanced by 10% or more. In both of the inventive example and the comparative example, the crystallization rate was 100%.

While the present invention has been particularly shown and described with reference to exemplary Examples thereof, it will be understood by those of ordinary skill in the art that various modifications will be possible and such modifications will be construed as being included within the scope of the invention.

For example, while in the Examples of the present disclosure, the laser marking is recognized by direct observation with the naked eye, the present invention is not limited thereto. That is, the position of the laser marking may be detected by using an optical measurement apparatus instead of direct observation.

INDUSTRIAL APPLICABILITY

Since the present invention can accurately and easily use the special region which is effective in preventing vibration of silicon melt surface in the vitreous silica crucible containing silicon melt in the pulling of a silicon single crystal using the CZ method, it becomes possible to efficiently perform the pulling of silicon single crystal using the CZ method. As a result, a high quality silicon single crystal ingot can be manufactured in a shorter time than in the conventional case and at an optimal pulling rate.

EXPLANATION OF REFERENCE SYMBOLS

1 edge portion of an opening of the vitreous silica crucible
2 special region
3 center of a bottom surface of the vitreous silica crucible
4 marking
5 range capable of accommodating a special region (straight body portion)
6 transparent layer
7 bubble containing layer
8 bottom portion
9 corner portion

The invention claimed is:

1. A vitreous silica crucible containing silicon melt, the vitreous silica crucible comprising:
   a special region for suppressing sloshing of melt surface of the silicon melt, provided on an inner wall of a straight body portion; and
   a marking, which is not a part of the special region, installed at least an upper end and a lower end of the special region, wherein the marking installed at the upper end of the special region is disposed at a location which is almost or completely in non-contact with the silicon melt during an entire period of pulling a silicon crystal,
   wherein the special region is made of vitreous silica whose raw material is primarily natural silica, and transparent layer other than the special region is made of vitreous silica whose raw material is primarily synthetic silica, and
   the marking is constituted by dot-shaped recesses each having a depth of 0.2 mm or more and diameter of 0.5 to 3.0 mm, and said dot-shaped recesses are aligned on the inner wall along a horizontal direction.

2. The vitreous silica crucible of claim 1, wherein the special region is installed between 5 mm downward from an edge portion of an opening of the vitreous silica crucible and 100 mm upward from the center of a bottom surface of the vitreous silica crucible, and the special region has a width ranging from 1 mm to 100 mm.

3. The vitreous silica crucible of claim 1, wherein the marking is a laser marking.

4. The vitreous silica crucible of claim 1, wherein the marking is a diamond tool marking.

* * * * *